(12) United States Patent
Muralidhar et al.

(10) Patent No.: US 7,800,164 B2
(45) Date of Patent: Sep. 21, 2010

(54) NANOCRYSTAL NON-VOLATILE MEMORY CELL AND METHOD THEREFOR

(75) Inventors: Ramachandran Muralidhar, Austin, TX (US); Rajesh A. Rao, Austin, TX (US); Michael A. Sadd, Mountain View, CA (US); Bruce E. White, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/397,849

(22) Filed: Mar. 4, 2009

(65) Prior Publication Data

US 2009/0166712 A1 Jul. 2, 2009

Related U.S. Application Data

(62) Division of application No. 11/530,053, filed on Sep. 8, 2006, now Pat. No. 7,517,747.

(51) Int. Cl.
*H01L 29/792* (2006.01)

(52) U.S. Cl. .............. 257/325; 257/410; 257/E29.309; 977/773

(58) Field of Classification Search ............ 257/325, 257/410, E29.309; 977/773
See application file for complete search history.

(56) References Cited

U.S. PATENT DOCUMENTS

| | | | | |
|---|---|---|---|---|
| 6,090,666 | A * | 7/2000 | Ueda et al. | 438/257 |
| 6,297,095 | B1 * | 10/2001 | Muralidhar et al. | 438/257 |
| 7,045,851 | B2 | 5/2006 | Black et al. | |
| 2003/0077863 | A1 | 4/2003 | Choi et al. | |
| 2004/0256662 | A1 | 12/2004 | Black et al. | |
| 2007/0105307 | A1 | 5/2007 | Jeng | |
| 2007/0128796 | A1 * | 6/2007 | Chu | 438/257 |

OTHER PUBLICATIONS

Restriction Requirement mailed Apr. 2, 2008 in U.S. Appl. No. 11/530,053.
Notice of Allowance mailed Dec. 12, 2008 in U.S. Appl. No. 11/530,053.
Non-final Rejection mailed May 16, 2008 in U.S. Appl. No. 11/530,053.
Restriction Requirement mailed Apr. 2, 2008 in U.S. Appl. No. 11/530,054.
Advisory Action mailed Feb. 6, 2009 in U.S. Appl. No. 11/530,054.
Non-final Rejection mailed May 1, 2009 in U.S. Appl. No. 11/530,054.
Non-final Rejection mailed May 14, 2009 in U.S. Appl. No. 11/530,054.
Non-final Rejection mailed Jan. 14, 2010 in U.S. Appl. No. 11/530,054.

* cited by examiner

*Primary Examiner*—Marcos D. Pizarro
(74) *Attorney, Agent, or Firm*—James L. Clingan; Kim-Marie Vo

(57) ABSTRACT

A method of forming a semiconductor device includes forming a first dielectric layer over a semiconductor substrate, forming a plurality of discrete storage elements over the first dielectric layer, thermally oxidizing the plurality of discrete storage elements to form a second dielectrics over the plurality of discrete storage elements, and forming a gate electrode over the second dielectric layer, wherein a significant portion of the gate electrode is between pairs of the plurality of discrete storage elements. In one embodiment, portions of the gate electrode is in the spaces between the discrete storage elements and extends to more than half of the depth of the spaces.

7 Claims, 4 Drawing Sheets

NANOCRYSTAL NON-VOLATILE MEMORY CELL AND METHOD THEREFOR

RELATED APPLICATIONS

This application is related to U.S. patent application Ser. No. 11/530,054, titled "Nanocrystal Non-Volatile Memory Cell and Method Therefor," assigned to the assignee hereof and filed even date herewith

FIELD OF THE INVENTION

The invention relates to integrated circuits and, more particularly, to integrated circuit memories that have memory cells with nanocrystals.

BACKGROUND OF THE INVENTION

The use of nanocrystals in non-volatile memories (NVMs) was primarily to have redundancy in each memory cell so that if there were a weak spot in a dielectric layer around the storage layer causing leakage of charge, then only a single nanocrystal in the storage layer would be adversely impacted and the remaining nanocrystals would still retain charge. There are typically difficulties with limited memory window, threshold voltage shift during program/erase cycling endurance, and read disturb of bits in a programmed state that are greater for nanocrystal NVM cells than for floating gate memory cells. The limited memory window arises from coulomb blockade effects that limit the charge storage capacity of the nanocrystals so that the total charge stored is less resulting in less threshold voltage differential between the logic high and logic low states. The program/erase cycling results in charge trapping, which can be cumulative, in the dielectric above the nanocrystals and thus reducing endurance. In the case of the floating gate, the charge is prevented from reaching the dielectric overlying the floating gate by the floating gate itself. Read disturb in bits that are in a programmed state arises due to the relatively higher field above the nanocrystals compared to the electric field above the floating gate in a floating gate device.

Thus, there is a need for NVM memory cells having nanocrystals overcoming or at least reducing these difficulties.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a memory device has nanocrystals that are substantially all much larger than nanocrystals typically used in memory cells. The oversized nanocrystals establish a contour that the overlying dielectric follows on its surface. The result is that the subsequent overlying gate has this contour as well because the gate wraps around the nanocrystals to some extent. This has the effect of providing better capacitive coupling between the gate and the nanocrystals which results in lower electric field in the dielectric overlying the nanocrystals. The reduced electric field has the effect of improving endurance, memory window, and read disturb. This is better understood by reference to the drawings and the following description.

Figure 1:
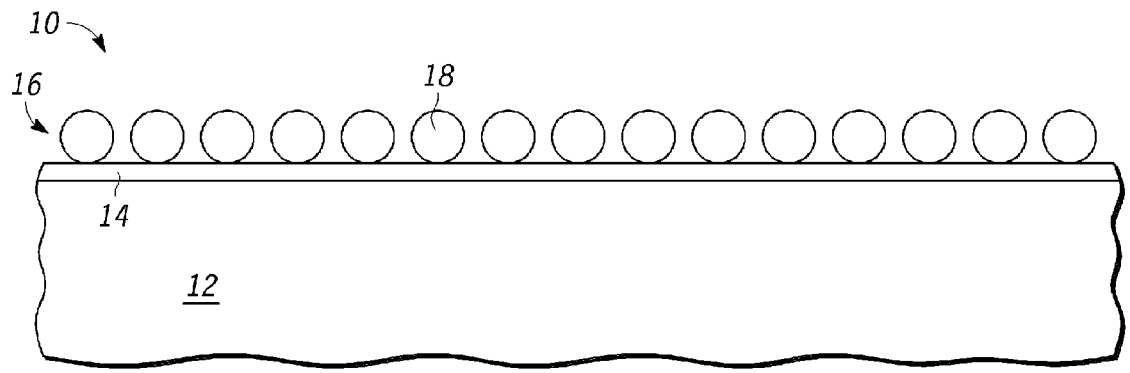
FIG. 1 is a cross section of a semiconductor device structure at a stage in processing according to a first embodiment of the invention.

Shown in FIG. 1 is a semiconductor device structure 10 comprising a semiconductor layer 12, a gate dielectric layer 14 on semiconductor layer 12, and a plurality of nanocrystals 16 on gate dielectric 14. Nanocrystal 18 is one of plurality 16 and is exemplary of nanocrystals 16. Semiconductor layer 12 may be part of a semiconductor-on-insulator (SOI) or bulk substrate. Semiconductor layer 12 is preferably silicon but could be another semiconductor material. Gate dielectric 14 is preferably thermally grown silicon oxide but could be another gate dielectric material. Nanocrystals 16, which function as storage elements, are preferably about 25 nanometers in diameter which is about 5 times more than is typically used for NVM memories using nanocrystals. They can be lower or higher diameter though but should be at least 12 nanometers in diameter. Nanocrystals 16 are preferably made using a CVD process using a silicon based precursor but another process may also be effective.

CVD silicon-based processes are known to be able to achieve the relatively large diameters. One such process uses silane as the precursor at a temperature range of 500-550 degrees Celsius at a partial pressure 700-800 millitorr for about 500 seconds. Additionally, nitrogen is co-flowed with the silane to obtain a total pressure of about 18 torr. Another process uses disilane as the precursor at a temperature range of 450-500 degrees Celsius, at a partial pressure at 80-100 millitorr, for about 300 seconds. Similar for this process, nitrogen is co-flowed with the disilane to obtain a total pressure of about 18 torr. In both processes, an anneal at 750 degrees Celsius in nitrogen is performed for 10 seconds. These processes do result in some variation, even more than two to one in some cases, in diameter across a wafer. What can occur is that two growing nanocrystals can come in contact and coalesce into a larger size nanocrystal. For the example shown, none of the nanocrystals exhibit this coalescing of two nanocrystals. Yet another silicon-precursor process that is more complex but that provides good uniformity and controllable spacing is described in U.S. patent application Ser. No. 11/065,579 and is incorporated herein by reference.

Figure 2:
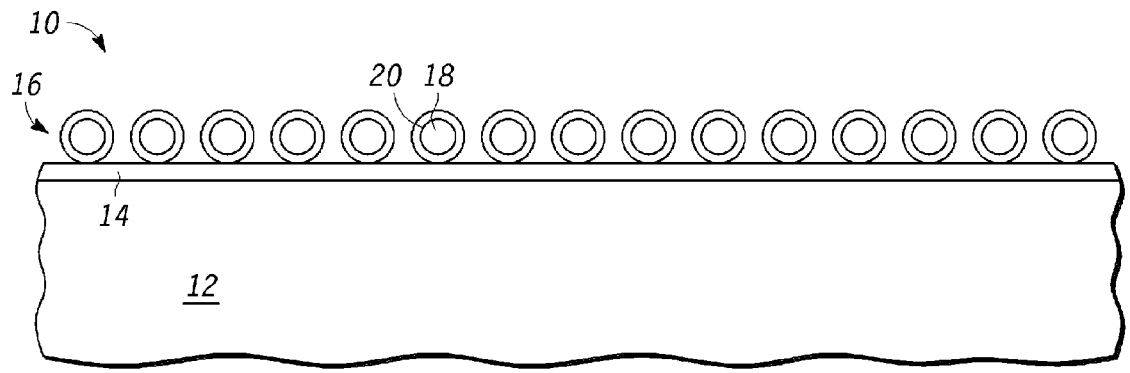
FIG. 2 is a cross section of the semiconductor device structure of FIG. 1 at a subsequent stage in processing to that shown in FIG. 1.

Shown in FIG. 2 is semiconductor device structure 10 after formation of a nitrided oxide layer 20 around plurality 16 of nanocrystals. This is achieved using a thermal oxide process similar to that used for forming gate dielectrics that are very thin, such as 20 Angstroms or less.

Figure 3:
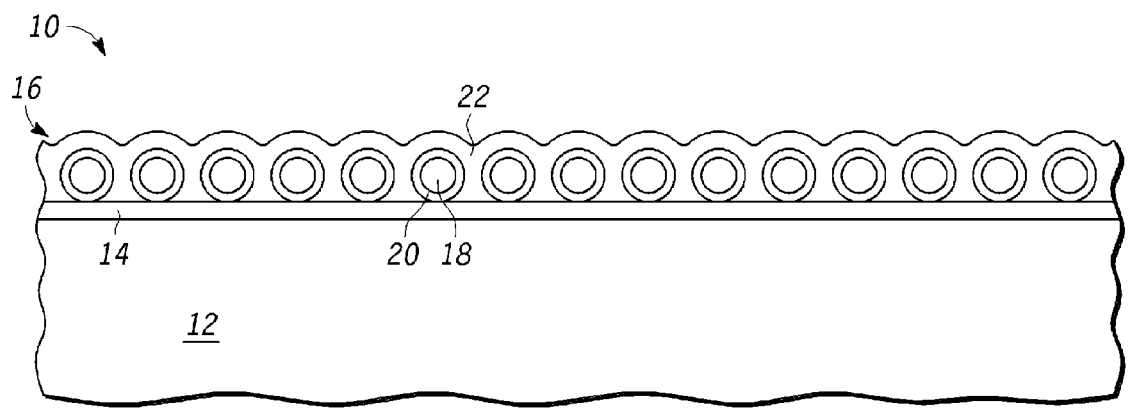
FIG. 3 is a cross section of the semiconductor device structure of FIG. 2 at a subsequent stage in processing to that shown in FIG. 2.

Shown in FIG. 3 is semiconductor device structure 10 after forming control dielectric 22 of high temperature oxide (HTO). HTO is typical for the oxide over the nanocrystals. The thickness of the HTO around nanocrystals 16 is preferably no more than 80 per cent of the diameter of nanocrystals 16. For the case that nanocrystals 16 are chosen to be 250 Angstroms in diameter, the preferred thickness of control dielectric 22 is 80 Angstroms. In such case, the thickness is only about 32 per cent of the diameter of nanocrystals 16. Nanocrystals 16 are preferably spaced apart by a distance greater than the thickness of control dielectric 22 but less than twice the thickness of control dielectric 22. In this example, the spacing that fits half way between these two requirements is about 120 Angstroms. As shown, control dielectric 22 has a top surface that follows the contour of the round top portions of nanocrystals 16.

Figure 4:
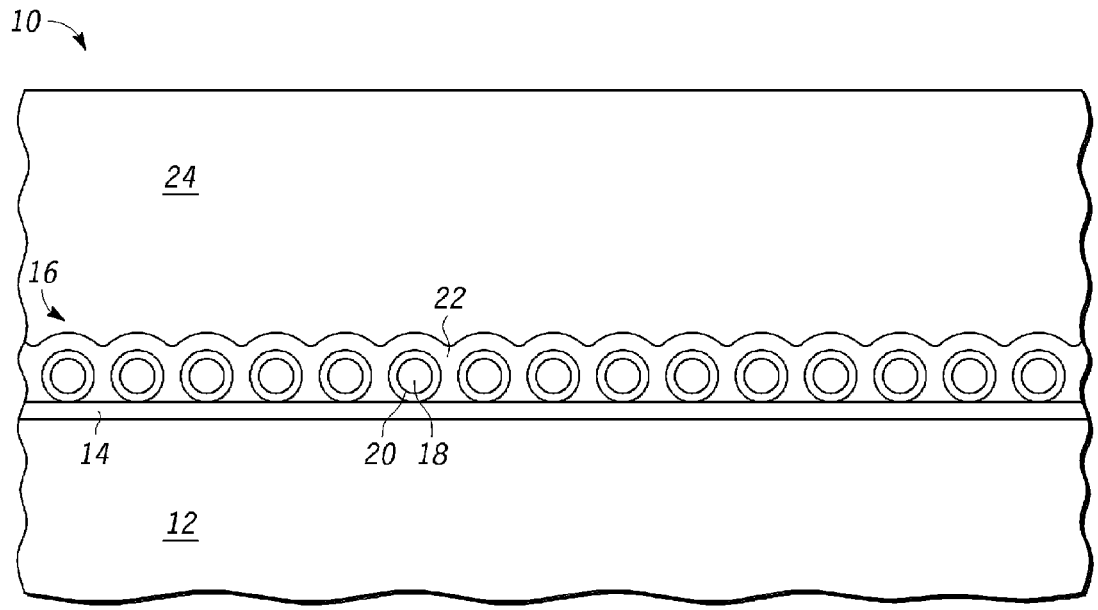
FIG. 4 is a cross section of the semiconductor device structure of FIG. 3 at a subsequent stage in processing to that shown in FIG. 3.

Shown in FIG. 4 is semiconductor device structure 10 after depositing a gate material 24 over control dielectric 22. Gate material 24 is preferably polysilicon but could another material such as one of the metals being considered for use as a gate for MOS transistors. The effect is that gate material 24 is in proximity to the top surface of nanocrystals 16 according to the top surface of control dielectric 22 which in turn follows the contour of the top portions of nanocrystals 16.

Figure 5:
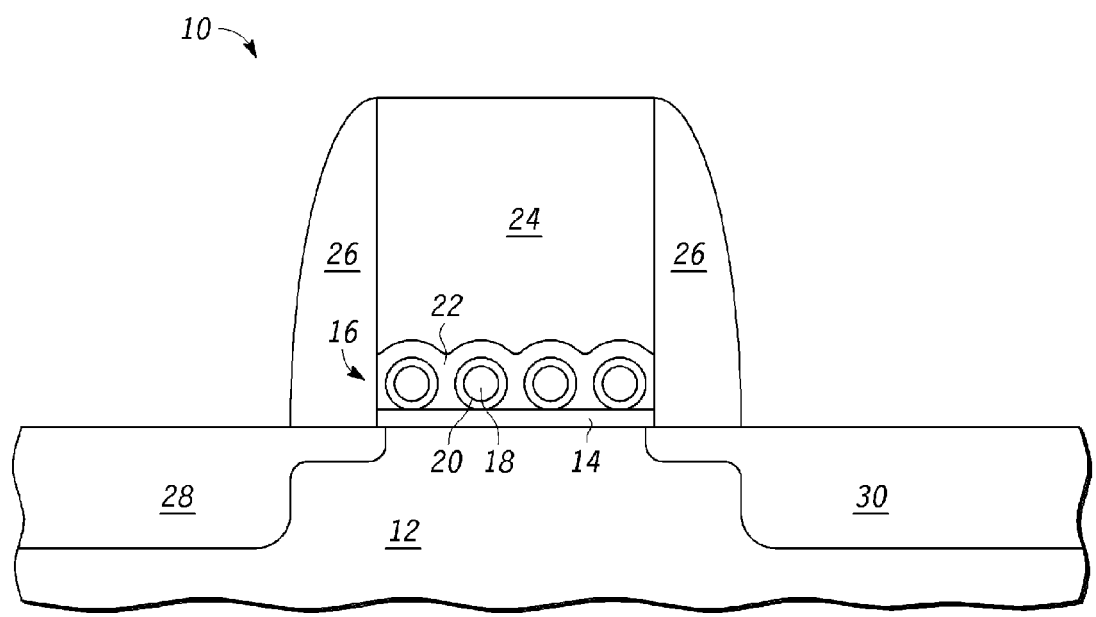
FIG. 5 is a cross section of the semiconductor device structure of FIG. 4 at a subsequent stage in processing to that shown in FIG. 4.

Shown in FIG. 5 is semiconductor device structure 10 after performing conventional process steps for forming a transistor memory cell after the gate material has been deposited over the nanocrystals. In FIG. 5, semiconductor device structure 10 shows an etched gate material 24 to form a gate, a sidewall spacer 26 around the gate, remaining nanocrystals 16 that are under the gate, and source/drains 28 and 30 on opposite sides of the gate and in semiconductor layer 12.

The resulting memory cell shown in FIG. 5 provides better coupling between the gate and nanocrystals 16 due to the top surface of control dielectric 22 following the contour of the top portions of nanocrystals 16. With improved coupling between the gate and nanocrystals 16 there is less voltage drop between the gate and nanocrystals 16 for a given gate voltage. This results in lower electrical field in the control dielectric 22 during operation of the device. The reduced electric field mitigates electron tunneling from the gate into nanocrystals during erase and electron tunneling from nanocrystals to gate during programming or READ. As a result improved memory window is obtained through better erase and programming, reduced read disturb, and improved endurance. Further, the lower electric field also results in less acceleration of electrons injected during programming but not captured by nanocrystals. The reduced acceleration of these electrons in the control dielectric reduces charge trapping in the control dielectric and improves program-erase cycling endurance of the memory device.

Figure 6:
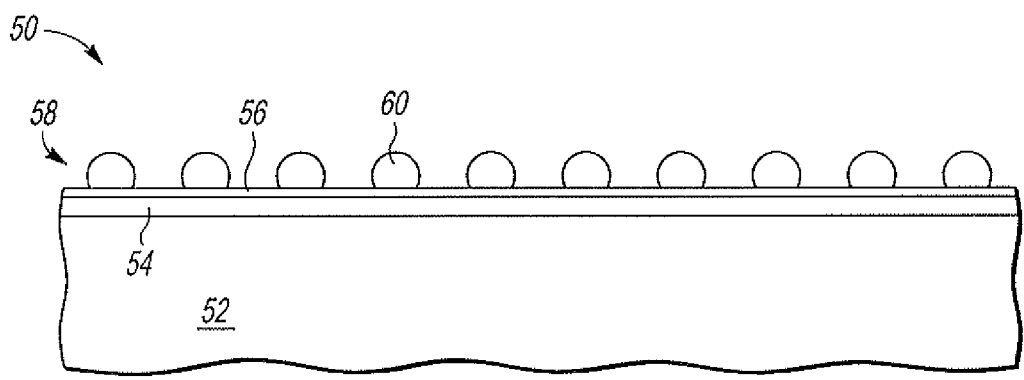
FIG. 6 is a cross section of a semiconductor device structure at a stage in processing according to a second embodiment of the invention.

Shown in FIG. 6 is a semiconductor device structure 50 comprising a semiconductor substrate 52, a gate dielectric layer 54 on semiconductor substrate 52, and a nitrided layer 56 formed at the surface of gate dielectric layer 54, and a plurality of nanocrystals 58 formed on nitrided layer 56. Nanocrystal 60 is one of plurality 58 and is exemplary of nanocrystals 58. Semiconductor layer 52 may be part of a semiconductor-on-insulator (SOI) or bulk substrate. Semiconductor layer 52 is preferably silicon but could be another semiconductor material. Gate dielectric 54 is preferably thermally grown silicon oxide but could be another gate dielectric material. Nanocrystals 58 are preferably hemispherically shaped and about 25 nanometers in diameter which is about 5 times more than is typically used for NVM memories using nanocrystals. They can be lower or higher diameter though but should be at least 12 nanometers in diameter. Nanocrystals 58 are made in substantially the same way as nanocrystals 16 of FIGS. 1-5, but are hemispherical due to being formed on nitrided layer 56 instead of on an oxide layer such as gate dielectric layer 14 of FIGS. 1-5. In this case nanocrystals 58 are spaced further apart, preferably about 25 nanometers apart. This is achieved in the described silane and disilane processes by increasing the temperature of deposition. For example, in the silane process, the temperature is increased to 600 to 650 Celsius. For the disilane process, the temperature is increased to 550 to 600 degrees Celsius. Nitrided layer 56 is formed by exposing gate dielectric layer 54 to decoupled plasma nitridation. Nitrided layer 56 is preferably about 10 Angstroms in thickness. Gate dielectric layer 54 has a thickness of preferably about 50 Angstroms.

Figure 7:
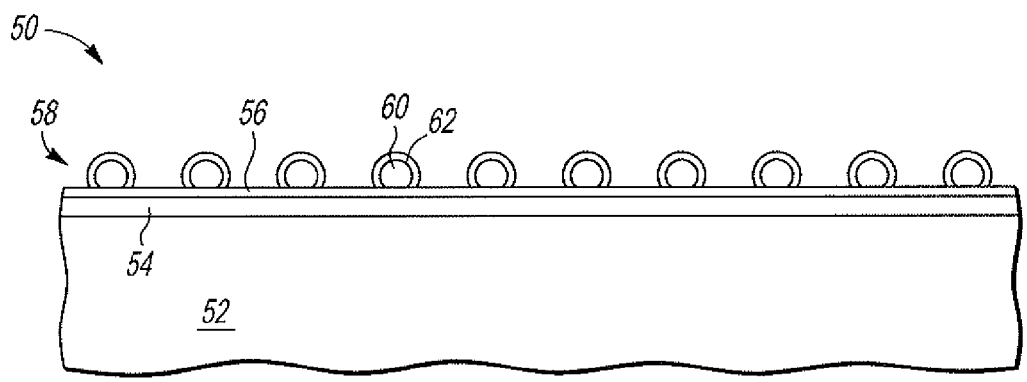
FIG. 7 is a cross section of the semiconductor device structure of FIG. 6 at a subsequent stage in processing to that shown in FIG. 6.

Shown in FIG. 7 is semiconductor device structure 50 after thermally growing a nitrided oxide layer 62 of about 5 to 10 nanometers in thickness. One way this can be achieved is by exposing nanocrystals 58 to nitric oxide (NO) at a relatively high temperature such as about 850 degrees Celsius.

Figure 8:
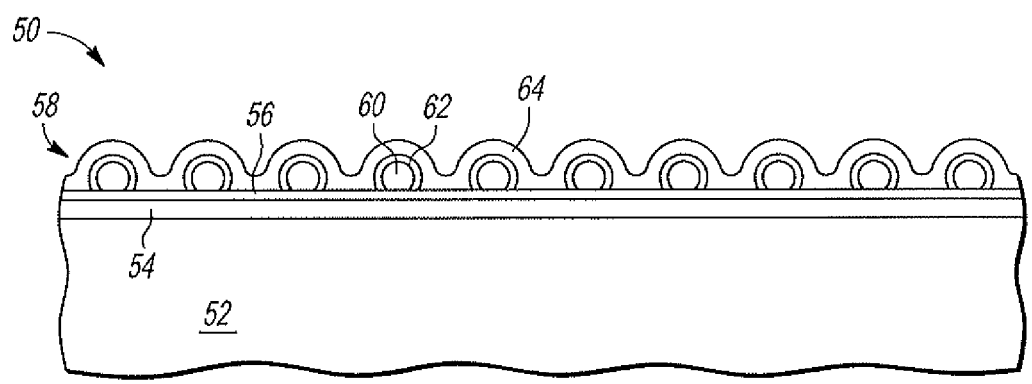
FIG. 8 is a cross section of the semiconductor device structure of FIG. 7 at a subsequent stage in processing to that shown in FIG. 7.

Shown in FIG. 8 is semiconductor device structure 50 after deposition of a control dielectric layer 64 on nitrided oxide layers of nanocrystals 58 and on nitrided layer 56 that is exposed in spaces between the various nanocrystals 58. This may be an optional layer because nitrided oxide layers 62 provide a dielectric that functions as a control dielectric for nanocrystals 58.

Figure 9:
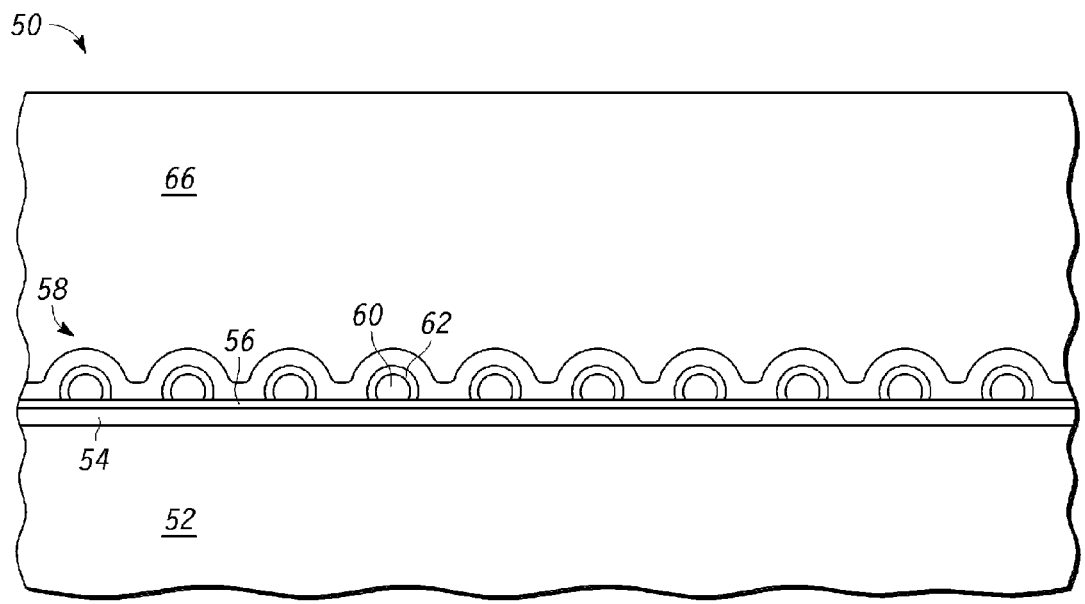
FIG. 9 is a cross section of the semiconductor device structure of FIG. 8 at a subsequent stage in processing to that shown in FIG. 8.

Shown in FIG. 9 is semiconductor device structure 50 after depositing a layer of gate material 66 over nanocrystals 58. Gate material is preferably polysilicon but could be another material such as a metal being considered as a gate for MOS transistors.

Figure 10:
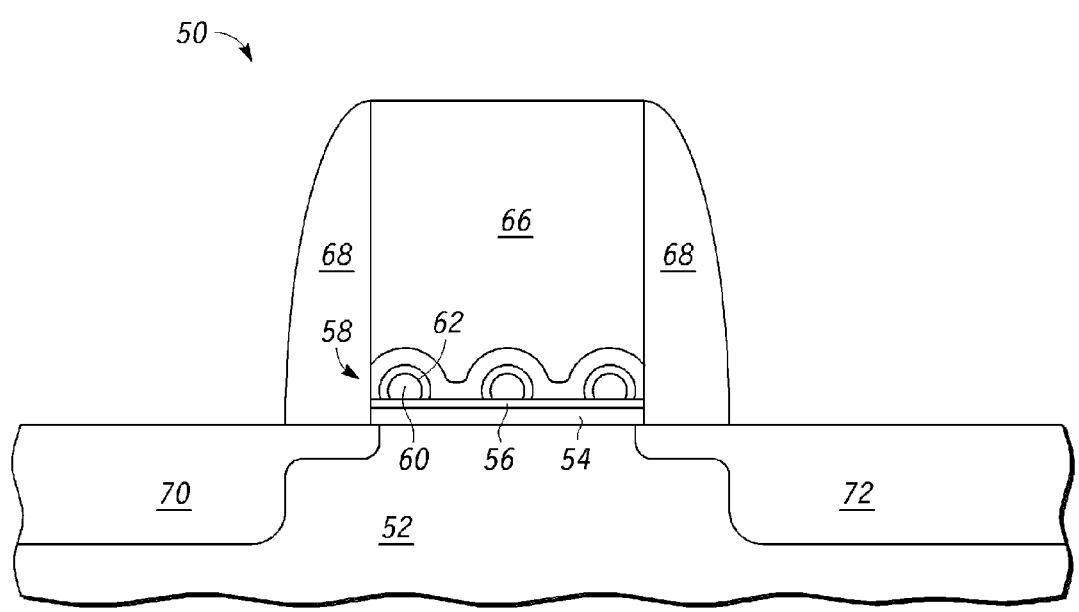
FIG. 10 is a cross section of the semiconductor device structure of FIG. 9 at a subsequent stage in processing to that shown in FIG. 9.

Shown in FIG. 10 is semiconductor device structure 50 after performing conventional process steps for forming a transistor memory cell after the gate material has been deposited over the nanocrystals similar as for semiconductor device 10 of FIG. 5. In FIG. 10, semiconductor device structure 50 shows an etched gate material 66 to form a gate, a sidewall spacer 68 around the gate, remaining nanocrystals 58 that are under the gate, and source/drains 70 and 72 on opposite sides of the gate and in semiconductor layer 52. The result is that there is a substantial portion of the gate between pairs of nanocrystals 58, pairs being ones that are adjacent.

The resulting memory cell shown in FIG. 10, similar to that shown in FIG. 5, provides better capacitive coupling than is typical for nanocrystal NVMs between the gate and nanocrystals 58 due to the top surface of control dielectric 22 following the whole contour of the portion of the nanocrystals 16 above nitrided layer 56. The gate has a substantial portion that is between adjacent nanocrystals. With improved capacitive coupling between the gate and nanocrystals 16 there is less voltage drop between the gate and nanocrystals 16 for a given gate voltage. The result of this reduced voltage drop is improved memory window through better erase and better programming, reduced read disturb, and improved program-erase cycling endurance.

In this example, the control dielectric layer 64 is optional if the nitrided oxide layer 62 on nanocrystals 58 is sufficient to withstand the voltage applied to the gate for programming and erase for nanocrystals 58 and also that gate dielectric 54 and nitrided layer 56 are sufficient to withstand the voltage applied to the gate for programming and erase. As a further alternative, nitrided layer 56 may be omitted. In such case, the exposed spaces between nanocrystals 58 will grow some nitrided oxide during the application of the nitric oxide that causes the growth of nitrided oxide layer 62 on nanocrystals 58. This would have the effect of reducing the need for adding control dielectric 64. In such case nanocrystals would be spherical because they would have been formed on an oxide layer. This is somewhat disadvantageous because a portion of the gate would be below the center point of the sphere and thus cause a partial bias against the desired direction of electron movement during program and erase. The adverse bias would be small and may be worth the benefit of the increase in gate dielectric thickness.

Various other changes and modifications to the embodiments herein chosen for purposes of illustration will readily occur to those skilled in the art. For example, nanocrystals were described as being the storage elements for the memory cells but a possible alternative for the storage elements could be nanowires. To the extent that such modifications and variations do not depart from the spirit of the invention, they are intended to be included within the scope thereof which is assessed only by a fair interpretation of the following claims.

The invention claimed is:

1. A semiconductor device comprising:
   a first discrete storage element over a semiconductor substrate having a first height;
   a second discrete storage element over the semiconductor substrate having a second height, wherein the first discrete storage element and the second discrete storage element are separated by a space; and
   the space has a depth;
   a first dielectric over the first discrete storage element and within the space;
   a second dielectric over the second discrete storage element and within the space; and
   a first portion of a gate electrode extending below the first height and the second height and between the first dielectric and the second dielectric, wherein the first portion extends within the space more than half of the depth.

2. The semiconductor device of claim 1, wherein the first portion of the gate electrode between the first dielectric and the second dielectric has a lateral dimension that is approximately 5 to approximately 10 nanometers.

3. The semiconductor device of claim 1, wherein the first dielectric has a first lateral dimension and the second dielectric has a second lateral dimension, wherein the first lateral dimension and the second lateral dimension are approximately 5 nanometers to approximately 10 nanometers.

4. The semiconductor device of claim 1, further comprising:
   a plurality of discrete storage elements over the semiconductor substrate, wherein the first discrete storage element and the second discrete storage element are portion of the plurality of discrete storage elements;
   dielectrics over each of the plurality of discrete storage elements, wherein the dielectrics include the first dielectric and the second dielectric; and
   portions of the gate electrode substantially between adjacent pairs of the plurality of discrete storage elements and their associated dielectrics, wherein the portions of the gate electrode include the first portion of the gate electrode.

5. The semiconductor device of claim 1, further comprising a tunnel dielectric over the semiconductor substrate, wherein the first discrete storage element and the second discrete storage element are over the tunnel dielectric.

6. The semiconductor device of claim 5, further comprising:
   a layer comprising nitride over the tunnel dielectric; and
   a third dielectric over the first dielectric and the second dielectric, wherein the first portion of the gate electrode is over a first portion of the third dielectric and between a second portion and a third portion of the third dielectric.

7. The semiconductor device of claim 6, wherein:
   the tunnel dielectric comprises a material selected from the group consisting of silicon dioxide, silicon oxynitride, hafnium oxide, aluminum oxide, and hafnium zirconate;
   the first discrete storage element comprises an element selected from the group consisting of silicon, germanium, and aluminum;
   the second discrete storage element comprises an element selected from the group consisting of silicon, germanium, and aluminum; and
   third dielectric comprises a material selected from the group consisting of silicon dioxide, aluminum oxide, tantalum pentoxide, and hafnium oxide.

\* \* \* \* \*